United States Patent
Huang et al.

(10) Patent No.: US 7,374,326 B2
(45) Date of Patent: May 20, 2008

(54) ILLUMINATION MODULE OF LIGHT EMITTING ELEMENTS

(75) Inventors: Yin-Chun Huang, Hsin-Chu (TW); Wei-Kuang Chu, Taipei (TW)

(73) Assignee: Transpacific IP, Ltd., Taipei (TW)

( * ) Notice: Subject to any disclaimer, the term of this patent is extended or adjusted under 35 U.S.C. 154(b) by 0 days.

(21) Appl. No.: 11/367,588

(22) Filed: Mar. 2, 2006

(65) Prior Publication Data
US 2006/0146538 A1 Jul. 6, 2006

Related U.S. Application Data

(63) Continuation of application No. 10/728,828, filed on Dec. 8, 2003.

(30) Foreign Application Priority Data
Aug. 29, 2003 (TW) .............................. 92215729 U

(51) Int. Cl.
*F21V 8/00* (2006.01)
(52) U.S. Cl. .................. 362/612; 362/613; 362/555
(58) Field of Classification Search .............. 362/31, 362/26, 561, 612, 613, 611, 600, 555
See application file for complete search history.

(56) References Cited

U.S. PATENT DOCUMENTS

| | | | |
|---|---|---|---|
| 5,954,423 A * | 9/1999 | Logan et al. | 362/235 |
| 6,481,131 B2 | 11/2002 | Gianotti et al. | |
| 6,502,968 B1 | 1/2003 | Simon | |
| 6,508,564 B1 | 1/2003 | Kuwabara et al. | |
| 6,729,737 B2 | 5/2004 | Jeon et al. | |
| 6,893,136 B2 | 5/2005 | Yang | |
| 7,108,385 B2 * | 9/2006 | Huang et al. | 362/631 |

* cited by examiner

*Primary Examiner*—Laura Tso
(74) *Attorney, Agent, or Firm*—Stolowitz Ford Cowger LLP

(57) ABSTRACT

An illumination module of light emitting elements is provided. The present illumination module includes a printed circuit board having a one-dimensional array of light emitting elements arranged thereon and a reflecting layer on the surface of the printed circuit board with the light emitting elements arranged thereon. The reflecting layer provides reflecting means for the light emitting elements, improving utilization of the light emitting from the light emitting elements, and thus increasing the luminance of the illumination module of light emitting elements.

32 Claims, 3 Drawing Sheets

ILLUMINATION MODULE OF LIGHT EMITTING ELEMENTS

CROSS-REFERENCE TO RELATED APPLICATION(S)

This application is a Continuation of prior U.S. application Ser. No. 10/728,828, filed Dec. 8, 2003 titled "ILLUMINATION MODULE OF LIGHTING ELEMENTS" by Y. Huang et al.

BACKGROUND OF THE INVENTION

1. Field of the Invention

The present invention relates to an illumination module of light emitting elements, and more particularly to an illumination module of light emitting elements utilized in a backlight system.

2. Description of the Prior Art

In recent years, so-called liquid crystal display devices using liquid crystal panels have been widely used as display devices, which serve as monitors for image reproducing apparatus or various information terminals.

In general, such a liquid crystal display device uses a passive matrix type of liquid crystal panel or an active matrix type of liquid crystal panel using non-linear devices. These types of liquid crystal panel are not of the self light emitting type, and so they require an illumination light source to form a visible image formed on the liquid crystal panel. Liquid crystal panels are divided into a transmission type and a reflection type. In monitors for information terminals, the transmission type of liquid crystal panel is widely used for the purpose of high-luminance and high-contrast display, and for this purpose a backlighting illumination light source (hereinafter referred to as a backlight) is installed on the back of the liquid crystal panel, and a visible image is formed by modulating light from this backlight to form an image on the liquid crystal panel.

FIG. 1 is a cross-sectional view illustrating an example of a conventional liquid crystal display device provided with a transmission type of liquid crystal panel and a backlighting illumination device, i.e. a so-called backlight, associated with an illumination source of light emitting diodes. The conventional liquid crystal device has a backlight stacked on the back of the transmission type of liquid crystal panel, and is constructed to modulate, with an image formed on the liquid crystal panel, illumination light which is emitted from the backlight and which passes through the liquid crystal panel. The modulated illumination light is caused to exit toward the observer side of the liquid crystal panel, thereby making the image visible.

Specifically, this kind of liquid crystal display device is constructed in the following manner, as seen in FIG. 1. In a liquid crystal panel 1, a liquid crystal layer is clamped between two transparent substrates 1A and 1B, and polarizers 1C are respectively provided on the observing surface side and the back-surface side of the liquid crystal panel 1. A backlight module 3 is provided, which includes an approximately rectangular transparent light guide 2 and a light source 3A formed of an illumination module of light emitting diodes installed along a light-incident surface of the light guide 2. This backlight module 3 is provided on the back surface of the liquid crystal panel 1. Light from the backlight module 3 is deflected toward the liquid crystal panel 1 at an intermediate position, while being propagating in the light guide 2, and illuminates the liquid crystal panel 1 from the back surface thereof. A light scattering area 10 formed by dot printing or the like is provided on the back surface of the light guide 2.

Furthermore, a reflector 4 for totally reflecting light which has existed from the light guide 2 on the back-surface side thereof and for returning the light to the liquid crystal panel 1 is installed on the back side of the light guide 2. Such a backlight 3 is stacked on the liquid crystal panel 1 with a light quantity distribution correction member such as a scattering film 12 or a prism plate (not shown), being interposed therebetween, whereby a transmission type of liquid crystal display device is constructed.

FIG. 2 is a schematic side view of the illumination module 3A of the light emitting diodes, which includes a printed circuit board 30, a one-dimensional array of light emitting diodes 31 and a plurality of resistors 32. The light emitting diodes 31 and resistors 32 are inter-disposed on the surface of the printed circuit board 30 toward the light-incident surface of the light guide 2. However, when the light emitting from the light emitting diodes 3A projects upon the light-incident surface of the light guide 2, part of the light is reflected back and absorbed by the printed circuit board 30 and the resistors 32 disposed thereon, which results in the loss of light energy. The light emitting from the illumination module 3A of the light emitting diodes 31 can not be effectively utilized, and adversely influencing the brightness and uniformity of the luminance of the backlight 3, and thus the liquid crystal display device.

Accordingly, it is an intention to provide an improved illumination module, which can alleviate the drawback of the conventional one.

SUMMARY OF THE INVENTION

It is one objective of the present invention to provide an illumination module of light emitting elements, which can increase utilization of the light emitting from the light emitting elements and therefore improving the luminance of the illumination module.

It is another objective of the present invention to provide an illumination module of light emitting elements, which can be used in a backlight system and improving the brightness and uniformity of luminance of the backlight system.

In order to achieve the above objectives of this invention, the present invention provides an illumination module of light emitting elements, including a printed circuit board having a one-dimensional array of light emitting elements arranged thereon, and a reflecting layer on the surface of the printed circuit board having the light emitting elements. The reflecting layer provides reflecting means for the light emitting elements. When the illumination module of light emitting elements of the present invention is used as a lateral light source of a backlight system, the light emitting from the light emitting elements projects upon a light-incident surface of a light guide of the backlight system, and part of the light reflected back by the light-incident surface of the light guide would impinge upon the reflecting layer on the printed circuit board and reflected back again to enter the light guide through the light-incident surface thereof. The utilization of the light emitting from the illumination module of the light emitting elements is improved. The brightness and uniformity of the luminance of the backlight system are also improved.

BRIEF DESCRIPTION OF THE DRAWINGS

The objectives and features of the present invention as well as advantages thereof will become apparent from the following detailed description, considered in conjunction with the accompanying drawings.

DESCRIPTION OF THE PREFERRED EMBODIMENTS

The present invention provides an illumination module of light emitting elements, which applies a reflecting layer on a printed circuit board having the light emitting elements arranged thereon. When part of light emitting from the light emitting elements is reflected back by a light-receiving surface and impinging upon the reflecting layer of the printed circuit board, the light would be reflected back again to project upon the light-receiving surface. As a consequence, the utilization of the light of the present illumination module can be improved.

The present illumination module of light emitting elements will be described in detail in accordance with preferred embodiments of the present invention with reference to accompanying drawings.

Figure 1:
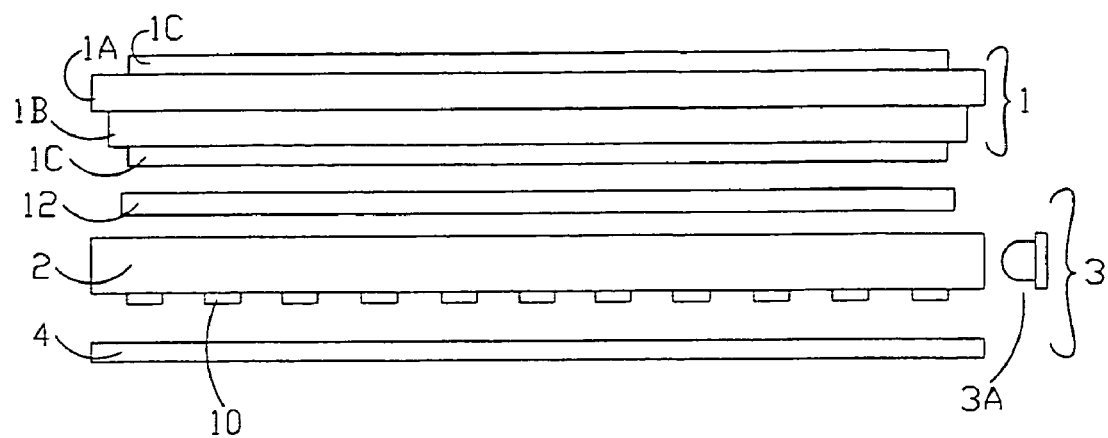
FIG. 1 is a cross-sectional view of a conventional liquid crystal display device provided with a transmission type of liquid crystal panel and a backlighting illumination device.
Figure 2:
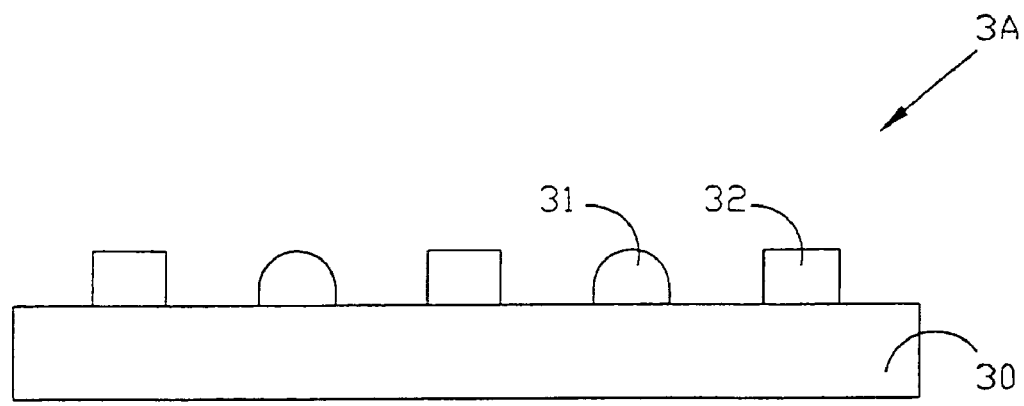
FIG. 2 is a schematic side view of an illumination module of light emitting diodes utilized in FIG. 1.
Figure 3A:
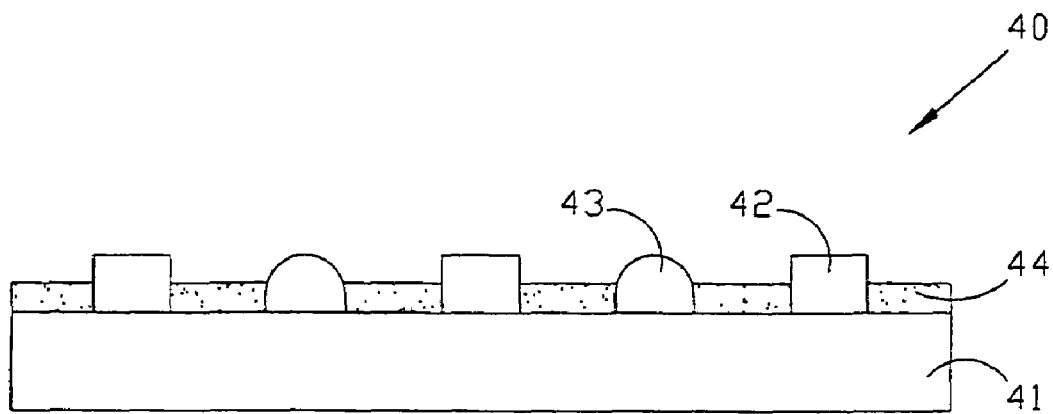
FIG. 3A is a schematic side view of an illumination module of light emitting elements according to a first preferred embodiment.

FIG. 3A is a schematic side view of the present illumination module 40 of light emitting elements according to a first preferred embodiment of the present invention. The illumination module 40 of light emitting elements includes a printed circuit board 41 having a plurality of resistors 42 disposed thereon, a one-dimensional array of light emitting elements 43 and a reflecting layer 44. The light emitting elements 43 and resistors 42 are inter-disposed on the same surface of the printed circuit board 41. The reflecting layer 44 is applied on the surface of the printed circuit board 41 having the light emitting elements 43 arranged thereon to provide reflecting means for them. Some electronic elements are also disposed on the surface of the printed circuit board 41 having the light emitting elements 43 arranged thereon and under the reflecting layer 44. The reflecting layer 44 can be provided on the printed circuit board 41 by a known technique, such as coating, sputtering and printing, or directly adhering on the surface of the printed circuit board 41. The reflecting layer 44 can be flexible or conductive, whose material can be selected from a group consisting of a high-gloss white paint, aluminum, copper, nickel, gold or another such metal.

Figure 3B:
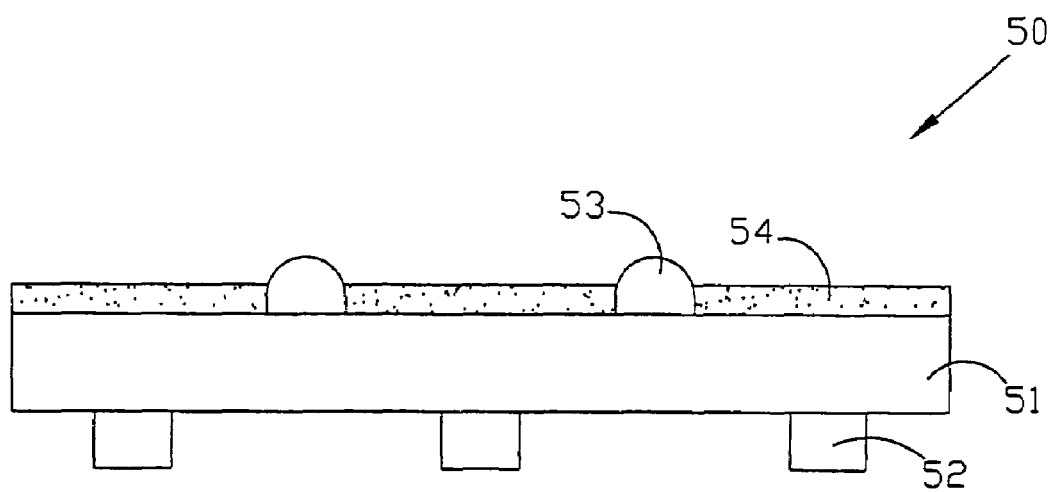
FIG. 3B is a schematic side view of an illumination module of light emitting elements according to a second preferred embodiment.

FIG. 3B is a schematic side view of the present illumination module 50 of light emitting elements according to a second preferred embodiment of the present invention. The illumination module 50 of light emitting elements includes a printed circuit board 51 having a plurality of resistors 52 disposed thereon, a one-dimensional array of light emitting elements 53 and a reflecting layer 54. The one-dimensional array of light emitting elements 53 are arranged on a surface of the printed circuit board 51 opposite to the surface thereof having the resistors 52 disposed thereon. Some electronic elements are also disposed on the surface of the printed circuit board 51 having the light emitting elements 53 arranged thereon. The reflecting layer 54 is applied on the surface of the printed circuit board 51 having the light emitting elements 53 arranged thereon to provide reflecting means for them. The reflecting layer 54 can be provided on the printed circuit board 51 by a known technique, such as coating, sputtering and printing, or directly adhering on the surface of the printed circuit board 51. The reflecting layer 54 can be flexible or conductive, whose material can be selected from a group consisting of a high-gloss white paint, aluminum, copper, nickel, gold or another such metal. When the reflecting layer 54 is conductive, the resistors 52 are disposed on the surface of the printed circuit board 51 opposite to the reflecting layer 54, which further can avoid short circuit happen between the resistors 52 and the reflecting layer 54.

Figure 4:
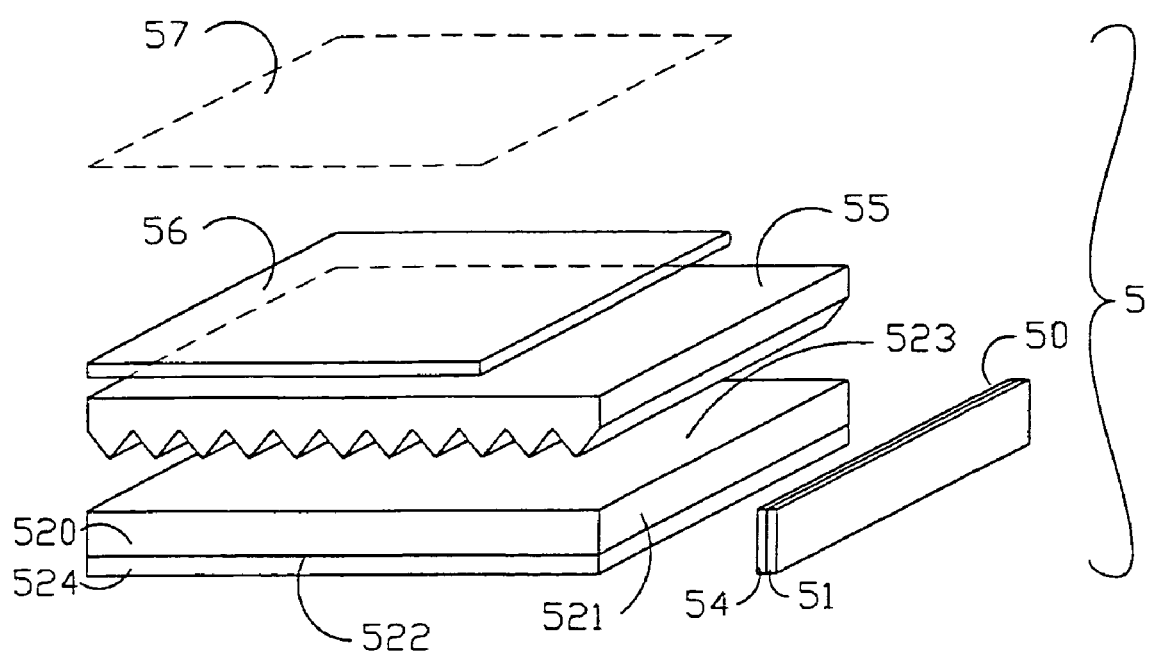
FIG. 4 is a schematic exploded view of a backlight system associated with the illumination module of FIG. 3B.

The present illumination module of light emitting elements can be used as a light source of a backlight system. FIG. 4 is a schematic exploded view of a backlight system 5 associated with the present illumination module 50, which includes a reflecting sheet 524, a light guide 520, a prism sheet 55 and a diffusing sheet 56 stacked in sequence. The light guide 520 has a rectangular body and at least a light-incident surface 521, a backside 522 and a light-existing surface 523. The illumination module 50 of light emitting elements is disposed beside the light-incident surface 521 of the light guide 520 for projecting light thereupon. However, the configuration of the illumination module 50 of light emitting elements is simplified to avoid that the drawing of FIG. 4 too complicated to be discriminated. Therefore, the light emitting elements 53 and resistors 52 are not shown in the drawing. The backside 522 of the light guide 520 has a pattern for light scattering formed thereon to direct light propagating in the light guide 520 to emit from the light-existing surface 523. The light guide 520 also can be a configuration such as wedge-shaped body, trapezoid body and symmetrical double-wedge shaped body. Alternately, the illumination module 40 of light emitting elements can instead of the illumination module 50 of light emitting elements used in the backlight system 5. The reflecting sheet 524 placed below the light guide 520 is used for reflecting the light penetrating through the backside 522 of the light guide 520 return to the light guide 520. The prism sheet 55 placed above the light guide 520 has a prism surface toward the light-exist surface 523 of the light guide 520, which is used to converge the luminance of the light guide 520 within the range of the view angle thereof to increase the brightness. The diffusing sheet 56 is disposed above the prism sheet 55 for improving the uniformity of the luminance of the light guide 520. The positions of the prism sheet 55 and the diffusing sheet 56 can be interchanged. And, a liquid crystal panel 57 can be placed above the whole backlight system to form a liquid crystal display. When the light emitting from the illumination module 50 of light emitting elements projects upon the light-incident surface 521 of the light guide 520, part of the light reflected from the light-incident surface 521 of the light guide 520 impinges upon the reflecting layer 54 on the printed circuit board 51, and would be reflected back to the light-incident surface 521 of the light guide 520. Therefore, the utilization of the illumination module 50 of light emitting elements is improved, and increasing the brightness and uniformity of the luminance of the backlight system 5.

The present illumination module of light emitting elements does not increase the complexity itself than the conventional one, and it is easily manufactured and achieved. When the present illumination module of light emitting elements is used as a light source of the backlight system, it can improve the brightness and uniformity of the luminance of the backlight system, and does not significantly increase the manufacturing cost. The present illumination module of light emitting elements provides economic values.

The embodiments are only used to illustrate the present invention, not intended to limit the scope thereof. Many modifications of the embodiments can be made without departing from the spirit of the present invention.

What is claimed is:

1. An apparatus, comprising:
   a printed circuit board;
   means for emitting light disposed on a first surface of said printed circuit board;
   means for reflecting light from of said means for emitting light; and
   means for resisting electrical current disposed on said first surface of said printed circuit board under said means for reflecting light.

2. The apparatus of claim 1, wherein said means for emitting light is disposed on said printed circuit board in a one-dimensional array.

3. The apparatus of claim 1, wherein said means for reflecting light comprises a flexible material.

4. The apparatus of claim 1, wherein said means for reflecting light comprises paint.

5. The apparatus of claim 1, wherein said means for reflecting light is selected from the group consisting of: high-gloss white paint, aluminum, copper, nickel, gold and titanium oxide, combinations thereof.

6. A method, comprising:
   emitting light from one or more light emitting elements disposed on a first surface of a printed circuit board;
   reflecting light from said one or more light emitting elements via a reflecting layer; and
   resisting electrical current via one or more resistors disposed on said first surface of said printed circuit board under said reflecting layer.

7. The method of claim 6, wherein said one or more light emitting elements comprise a plurality of light emitting elements disposed on said printed circuit board in a one-dimensional array.

8. The method of claim 6, wherein said reflecting layer comprises a flexible material.

9. The method of claim 6, wherein said reflecting layer comprises paint.

10. The method of claim 6, wherein said reflecting is selected from the group consisting of: high-gloss white paint, aluminum, copper, nickel, gold and titanium oxide, and combinations thereof.

11. A system, comprising:
    an illumination module, comprising:
      a printed circuit board,
      one or more light emitting elements disposed on a first surface of said printed circuit board,
      a reflecting layer adapted to reflect light from said one or more light emitting elements, and
      one or more resistors disposed on said first surface of said printed circuit board under said first surface of said reflecting layer;
    a light guide disposed beside the illumination module, the light guide capable receiving light from the illumination module; and
    a liquid crystal panel disposed proximate the light guide.

12. The system of claim 11, wherein said one or more light emitting elements comprise a plurality of light emitting elements disposed on said printed circuit board in a one-dimensional array.

13. The system of claim 11, wherein said reflecting layer comprises a flexible material.

14. The system of claim 11, wherein said reflecting layer comprises paint.

15. The system of claim 11, wherein said reflecting layer is selected from the group consisting of: high-gloss white paint, aluminum, copper, nickel, gold and titanium oxide, and combinations thereof.

16. The system of claim 11, wherein the light guide comprises, a light-exiting surface capable of emitting light, a light-incident surface disposed beside the illumination module, and a backside capable of scattering light to emit from the light-existing surface.

17. The system of claim 11, further comprising a reflective sheet positioned on a side of the light guide opposite the liquid crystal panel.

18. The system of claim 11, further comprising a prism sheet positioned between the light guide and the liquid crystal panel.

19. The system of claim 11, further comprising a diffusion sheet positioned between the light guide and the liquid crystal panel.

20. A liquid crystal panel backlight system, comprising:
    a printed circuit board;
    one or more light emitting elements disposed on a first surface of said printed circuit board;
    a reflecting layer adapted to reflect light from said one or more light emitting elements; and
    one or more resistors disposed on said first surface of said printed circuit board under—said reflecting layer.

21. The liquid crystal panel backlight system of claim 20, wherein the liquid crystal panel backlight system is selected from the group consisting of passive matrix-type liquid crystal panels or active matrix-type liquid crystal panels.

22. The liquid crystal panel backlight system of claim 20, wherein said one or more light emitting elements comprise a plurality of light emitting elements disposed on said printed circuit board in a one-dimensional array.

23. The liquid crystal panel backlight system of claim 20, wherein said reflecting layer comprises a flexible material.

24. The liquid crystal panel backlight system of claim 20, wherein said reflecting layer comprises paint.

25. The liquid crystal panel backlight system of claim 20, wherein said reflecting layer is selected from the group consisting of: high-gloss white paint, aluminum, copper, nickel, gold and titanium oxide, and combinations thereof.

26. A display device, comprising:
    an illumination module, comprising:
      a printed circuit board,
      one or more light emitting elements disposed on a first surface of said printed circuit board,
      a reflecting layer adapted to reflect light from said one or more light emitting elements, and
      one or more resistors disposed on said first surface of said printed circuit board under—said reflecting layer; and
    a liquid crystal panel disposed proximate the illumination module.

27. The display device of claim 26, wherein the display device comprises a monitor.

28. The display device of claim 26, wherein the liquid crystal panel is selected from the group consisting of passive matrix-type liquid crystal panels or active matrix-type liquid crystal panels.

29. The display device of claim 26, wherein said one or more light emitting elements comprise a plurality of light emitting elements disposed on said printed circuit board in a one-dimensional array.

30. The display device of claim 26, wherein said reflecting layer comprises a flexible material.

31. The display device of claim 26, wherein said reflecting layer comprises paint.

32. The display device of claim 26, wherein said reflecting layer is selected from the group consisting of: high-gloss white paint, aluminum, copper, nickel, gold and titanium oxide, and combinations thereof.

* * * * *

UNITED STATES PATENT AND TRADEMARK OFFICE
CERTIFICATE OF CORRECTION

PATENT NO.       : 7,374,326 B2                                  Page 1 of 1
APPLICATION NO.  : 11/367588
DATED            : May 20, 2008
INVENTOR(S)      : Yin-Chun Huang It is certified that error appears in the above-identified patent and that said Letters Patent is hereby corrected as shown below:

At column 5, line 21, please delete "of" after the word -- from --.

At column 5, line 36, please delete "oxide," and insert -- oxide, and --.

At column 6, line 2, please delete "capable" and insert -- capable of --.

At column 6, line 18, please delete "comprises," and insert -- comprises --.

Signed and Sealed this

Second Day of November, 2010

David J. Kappos
*Director of the United States Patent and Trademark Office*